(12) United States Patent
Ise

(10) Patent No.: US 7,974,131 B2
(45) Date of Patent: Jul. 5, 2011

(54) NONVOLATILE MEMORY COMPRISING A CIRCUIT CAPABLE OF MEMORY LIFE TIME RECOGNIZING

(75) Inventor: Masahiro Ise, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/399,718

(22) Filed: Mar. 6, 2009

(65) Prior Publication Data

US 2009/0168512 A1 Jul. 2, 2009

Related U.S. Application Data

(63) Continuation of application No. PCT/JP2006/317653, filed on Sep. 6, 2006.

(51) Int. Cl.
*G11C 16/06* (2006.01)
(52) U.S. Cl. ........... 365/185.2; 365/185.18; 365/185.03; 365/185.23
(58) Field of Classification Search ............... 365/185.2, 365/185.18
See application file for complete search history.

(56) References Cited

U.S. PATENT DOCUMENTS

| | | | |
|---|---|---|---|
| 5,586,074 A | 12/1996 | Higuchi | |
| 6,091,643 A | 7/2000 | Kawakami | |
| 6,188,603 B1 * | 2/2001 | Takeda | 365/185.09 |
| 6,914,816 B2 | 7/2005 | Sugiura et al. | |
| 6,967,867 B2 * | 11/2005 | Hamaguchi | 365/185.03 |
| 2003/0227811 A1 | 12/2003 | Sugiura et al. | |

FOREIGN PATENT DOCUMENTS

| | | |
|---|---|---|
| JP | 6-139786 A | 5/1994 |
| JP | 6-223590 A | 8/1994 |
| JP | 11-53890 A | 2/1999 |
| JP | 11-102592 A | 4/1999 |
| JP | 11-283381 A | 10/1999 |
| JP | 2002-208286 A | 7/2002 |
| JP | 2004-14043 A | 1/2004 |
| JP | 2004-296012 A | 10/2004 |

OTHER PUBLICATIONS

International Search Report of PCT/JP2006/317653, date of mailing Nov. 21, 2006.
Notification of Transmittal of Translation of the International Preliminary Report on Patentability (Form PCT/IB/338) of International Application No. PCT/JP2006/317653 mailed Mar. 26, 2009 with Forms PCT/IB/373 and PCT/ISA/237.
"Korean Office Action", mailed by KPO and corresponding to Korean application No. 2009-7004777 on Sep. 28, 2010, with English translation.

* cited by examiner

*Primary Examiner* — Hoai V Ho
*Assistant Examiner* — Fernando N Hidalgo
(74) *Attorney, Agent, or Firm* — Fujitsu Patent Center

(57) ABSTRACT

A nonvolatile memory wherein remaining lifetimes of memory cells can be accurately determined is provided, the nonvolatile memory includes: plural memory cell groups, assigned with respective addresses, arranged for respective words and used for storing one word of data; plural dummy cell groups also assigned the respective addresses and having different ranks of rewriting lifetimes; a writing circuit which, when writing data into a memory cell group having a given address, also writes the data into a dummy cell group having the same address at the same time; a lifetime recognizing circuit which recognizes an estimated number of past writing times by determining whether each dummy cell group can be successfully accessed; and a control section which controls operations of the memory cell groups and the dummy cell groups in response to an externally given command.

2 Claims, 10 Drawing Sheets

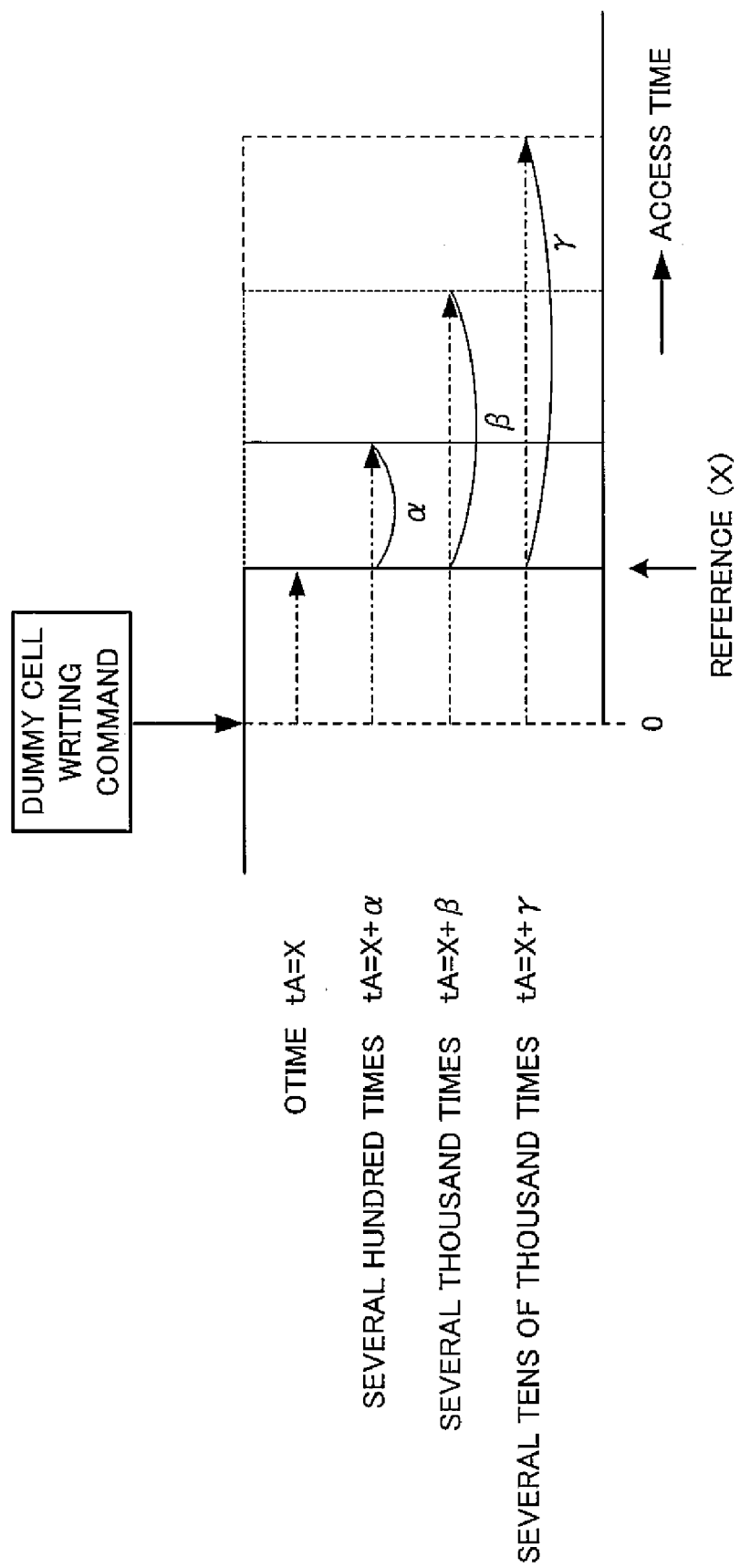

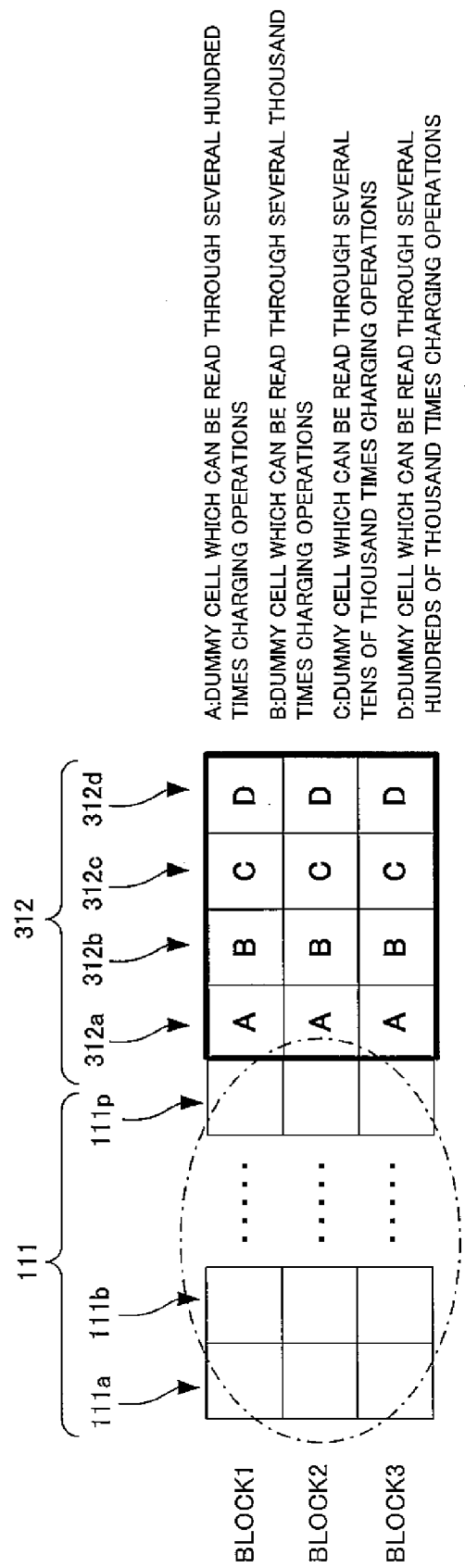

NONVOLATILE MEMORY COMPRISING A CIRCUIT CAPABLE OF MEMORY LIFE TIME RECOGNIZING

FIELD

The present invention relates to a nonvolatile memory in which data can electrically be written, erased and read.

BACKGROUND

An EEPROM (Electronically Erasable and Programmable Read Only Memory) is widely known as a kind of a nonvolatile memory in which data can electrically be written, erased and read. A flash memory (flash type EEPROM) is a representative example.

The flash memory includes a MOS (Metal Oxide Semiconductor) transistor including a source region and a drain region formed on a semiconductor substrate, a gate insulator formed between the source region and the drain region on the semiconductor substrate 100, a floating gate formed on the gate insulator, an insulation thin film formed on the floating gate, and a control gate formed on the insulation thin film.

In order to write data in the flash memory, a source terminal is brought into a ground level, predetermined voltage is applied to a drain terminal and a gate terminal to generate potential difference between the drain region and the floating gate, negative charge (electrons) is accumulated in the floating gate through the gate insulator by the potential difference, continuity of channel of the MOS transistor is varied, thereby recording data.

On the other hand, in order to erase data written in the flash memory, the drain terminal is opened, the gate terminal is brought into the ground level, voltage higher than normal level is applied to the source terminal to generate potential difference between the source region and the floating gate, accumulated negative charge (electrons) on the floating gate is pulled out to the source terminal through the gate insulator.

However, if the writing and erasing operations of data, i.e., charging and pulling-out operations of electrons into and from the floating gate are repeated many times, this operations forcibly passes the electrons through the insulator, and the insulator is gradually deteriorated and a faulty cell in which data can not be recorded is generated. A nonvolatile memory is usually constituted as a memory cell array in which plural blocks including cells of plural bits are arranged, and of the memory cell array, even a single faulty cell is generated, the lifetime of the memory cell expires.

The lifetime of the memory cell is usually about several tens of thousand, but the lifetime is largely varied. It is not easy to tell remaining lifetime of the memory cell, and various determining methods of the lifetime are conventionally proposed. For example, there is proposed a technique in which a rewriting time counter for counting the number of rewriting times of data for each block of memory cell array, a memory portion in which the count value is stored, and a control circuit for controlling the number of rewriting times counting operation, the storing operation, the erasing operation and the reading operation are prepared, and it is determined that a memory cell of a block whose count value reaches a predetermined value is deteriorated (see Patent Document 1, for example). However, since clear correlation does not exist between the number of rewriting times of data and deterioration of the memory cell generated by rewriting of data, the remaining lifetime of the memory cell cannot be determined precisely by the method of the Patent Document 1.

There is disclosed a deterioration detecting method of a memory cell in which erasing time measuring means for measuring erasing time elapsed until information written in a memory cell is erased, a reference erasing time memory for storing preset reference erasing time, and deterioration detecting means for detecting deterioration of the memory cell by comparing the measured erasing time and the preset reference erasing time with each other are used (see Patent Document 2, for example).

In the method of the Patent Document 2, since high correlation does not exist between the erasing time of information and deterioration of a memory cell, the remaining lifetime of the memory cell cannot be accurately determined.

Patent Document 1: Japanese Laid-open Patent Publication No. H6-223590

Patent Document 2: Japanese Laid-open Patent Publication No. 2002-208286

In view of the above circumstances, it is an object of the present invention to provide a nonvolatile memory capable of precisely determining a remaining lifetime of a memory cell.

SUMMARY

A first nonvolatile memory of the present invention that achieves the above object includes:

plural memory cells assigned with respective addresses, arranged for respective words and used for storing one word of data;

plural dummy cells assigned with respective addresses, arranged for respective words and having different ranks of rewriting lifetimes;

a writing circuit which, when writing data into a memory cell having a given address, concurrently writes the data into a dummy cell having an address corresponding to the given address; and a lifetime recognizing circuit which recognizes an estimated number of past writing times by determining whether each dummy cell can be successfully accessed.

According to the first nonvolatile memory of the present invention, it is possible to recognize an estimated number of past writing times by determining which dummy cells can be successfully accessed. With this, it is possible to precisely determine remaining lifetimes of memory cells of the nonvolatile memory.

A second nonvolatile memory of the present invention that achieves the above object includes:

plural memory cells assigned with respective addresses, arranged for respective words and used for storing one word of data;

a dummy cell assigned with an address and generating an access time delay in accordance with the number of writing times;

a writing circuit which, when writing data into a memory cell having a given address, concurrently writes the data into a dummy cell having an address corresponding to the given address; and a lifetime recognizing circuit which recognizes an estimated number of past writing times by determining a level of access time delay in the dummy cell at the time of reading operation.

According to the second nonvolatile memory of the present invention, it is possible to recognize an estimated number of past writing times by determining a level of access time delay in the dummy cell at the time of reading operation. With this, it is possible to precisely determine a remaining lifetime of a memory cell of the nonvolatile memory.

A third nonvolatile memory of the present invention that achieves the above object includes:

plural memory cells assigned with respective addresses, arranged for respective words and used for storing one word of data;

plural dummy cells assigned with respective addresses, arranged for respective words and becoming readable by receiving past electric charges accumulated up to a predetermined amount of electric charge;

a writing circuit which, when writing data into a memory cell having a given address, charges a different amount of electric charge in accordance with each dummy cell, to a dummy cell having an address corresponding to the given address; and a lifetime recognizing circuit which recognizes an estimated number of past writing times by determining whether each dummy cell can be read.

According to the third nonvolatile memory of the invention, it is possible to recognize an estimated number of past writing times by determining whether each dummy cell can be read. With this, it is possible to precisely determine a remaining lifetime of a memory cell of the nonvolatile memory.

As explained above, according to the nonvolatile memory of the present invention, it is possible to precisely determine a remaining lifetime of a memory cell.

Since the nonvolatile memory of the present invention has a function for determining a remaining lifetime of an element itself, a circuit scale of a system is reduced, and the number of designing steps can be reduced.

BRIEF DESCRIPTION OF DRAWINGS

FIG. 9 is an explanatory diagram of operation of the dummy cell in the embodiment of the second nonvolatile memory of the invention;

FIG. 10 is a schematic configuration diagram of memory cells and dummy cells of an embodiment of a third nonvolatile memory of the invention;

DESCRIPTION OF EMBODIMENTS

Embodiments of the present invention will be described with reference to the drawings below.

Figure 1:
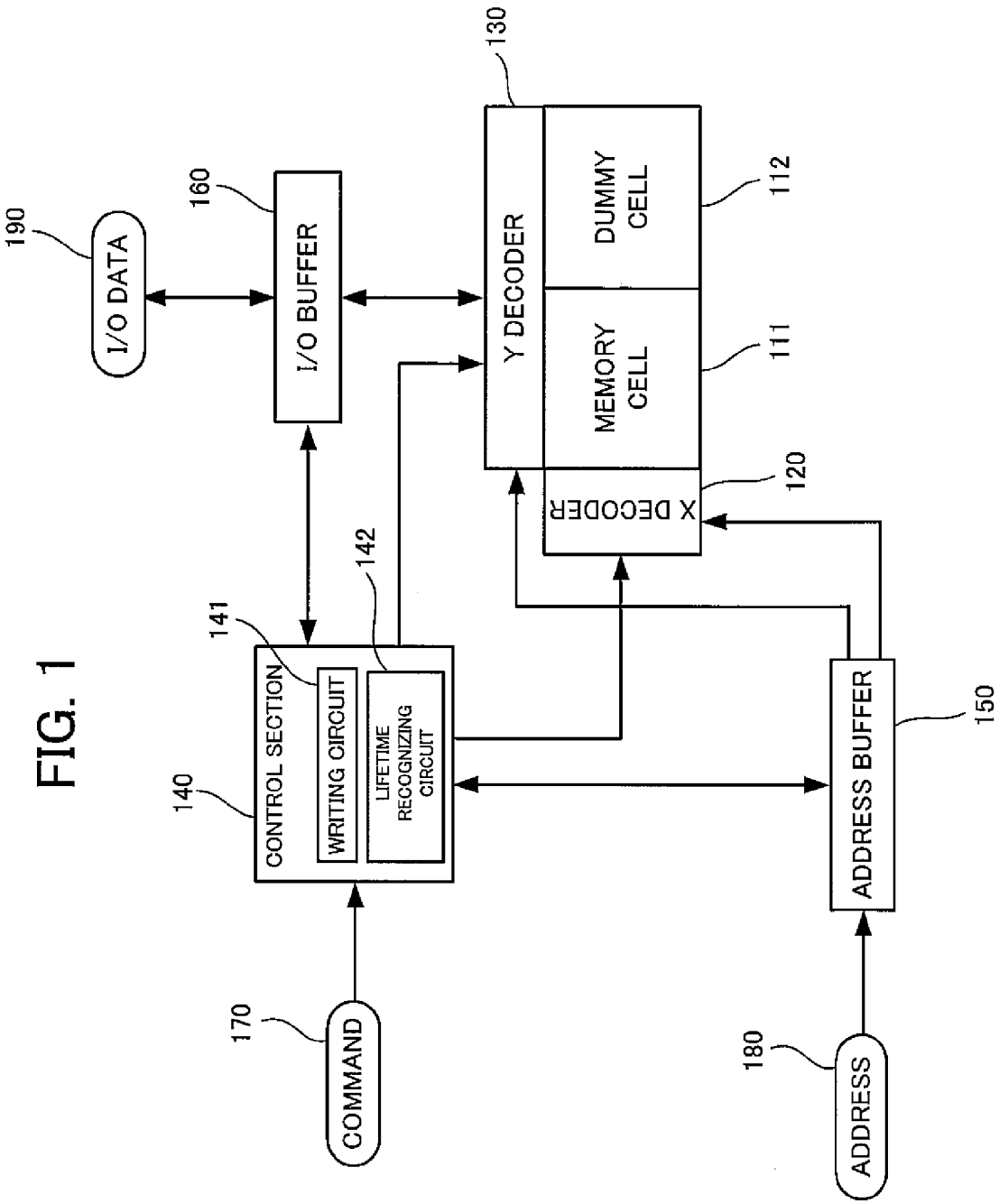
FIG. 1 is a schematic configuration diagram of a nonvolatile memory of the present invention that is common in all embodiments.

FIG. 1 is a schematic configuration diagram illustrating an embodiment of a first nonvolatile memory of the present invention.

As illustrated in FIG. 1, a nonvolatile memory 100 of the present invention includes memory cell groups 111 assigned with respective addresses, arranged for respective words and used for storing one word of data, dummy cell groups 112 having different ranks of rewriting lifetimes, and a control section 140 which controls operations of the memory cell groups 111 and the dummy cell groups 112 in accordance with a command 170 sent from outside. The control section 140 includes a writing circuit 141 which, when writing data into one of the memory cell groups 111 having a given address, also writes the data into one of dummy cell groups 112 having the same address at the same time, and a lifetime recognizing circuit 142 which recognizes an estimated number of past writing times by determining whether each dummy cell group 112 can be successfully accessed.

The nonvolatile memory 100 also includes an X decoder 120 which controls addresses in the X direction of the memory cell groups 111 and the dummy cell groups 112, a Y decoder 130 which controls addresses in the Y direction of the memory cell groups 111 and the dummy cell groups 112, an address buffer 150 which temporarily stores addresses 180 sent from outside, and an I/O buffer 160 which temporarily stores data which is input to and output from the memory cells 110.

Figure 2:
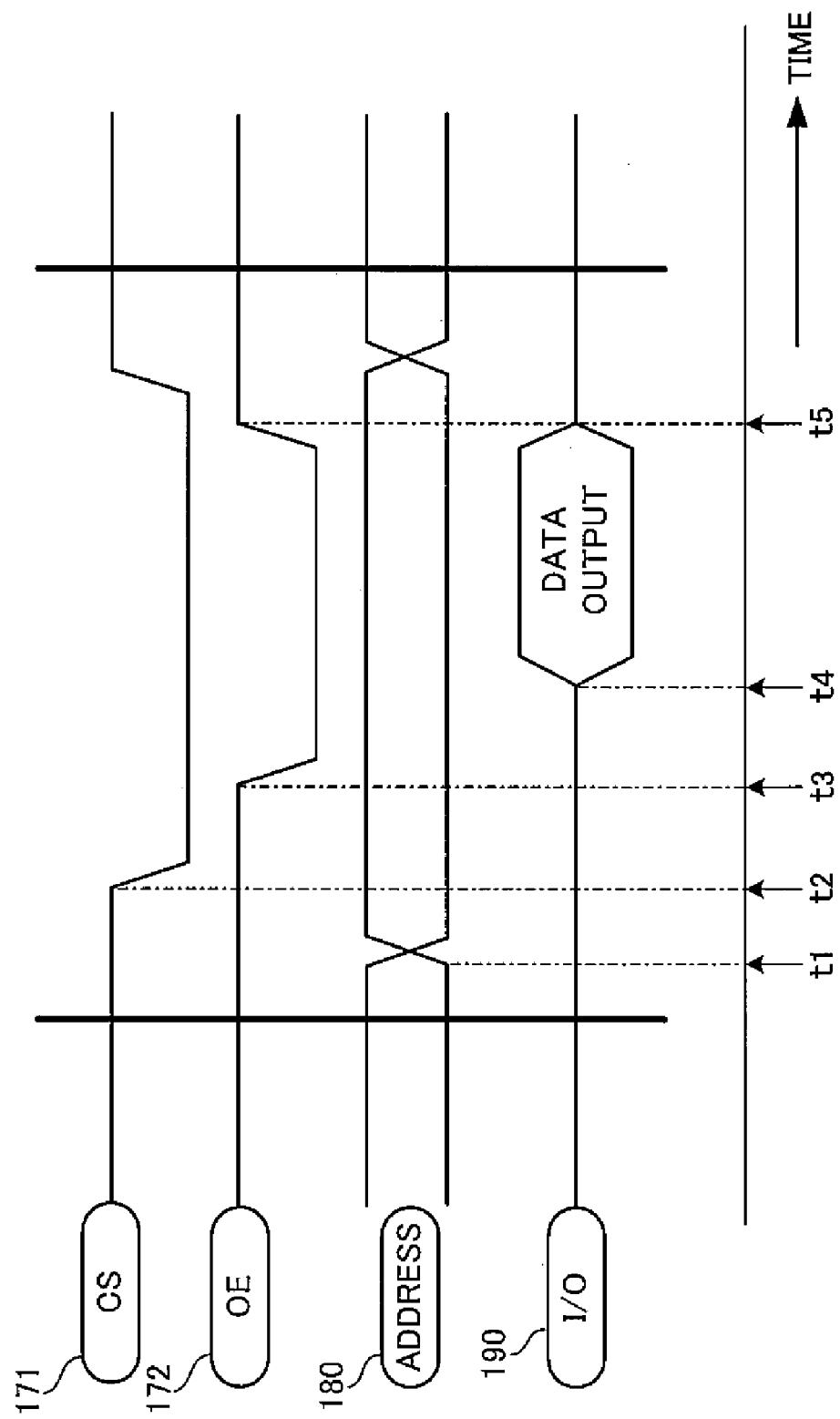
FIG. 2 is a diagram illustrating basic operation of the nonvolatile memory in FIG. 1.

FIG. 2 illustrates an example of a reading operation among basic operations of the nonvolatile memory in FIG. 1.

FIG. 2 illustrates the example of the reading operation among the reading operations and the writing operations, which are basic operations of the nonvolatile memory. That is, if the address buffer 150 of the nonvolatile memory 100 (see FIG. 1) is provided with a reading address 180 (time t1) and the control section 140 is provided with a CS (Chip Select) command 171 (time t2), the control section 140 analyzes the address data, and the control section 140 gives X address and Y address to the X decoder 120 and the Y decoder 130. Next, if an OE (Output Enable) command 172 is given to the control section 140 (time t3), data 190 (see FIG. 1) is output to outside from the memory cell group 111 through the I/O buffer 160 (time t4 to t5).

Although FIG. 2 illustrates the example of data reading operation, if data is to be written, a writing address is given to the address buffer 150 and writing data is given to the I/O buffer 160 from outside. A CS command and a WE (Write Enable) command are given to the control section 140. The control section 140 analyzes the address data, gives X address and Y address to the X decoder 120 and the Y decoder 130, and writes writing data 190 given from outside through the I/O buffer 160 into the memory cell group 111.

Figure 3:
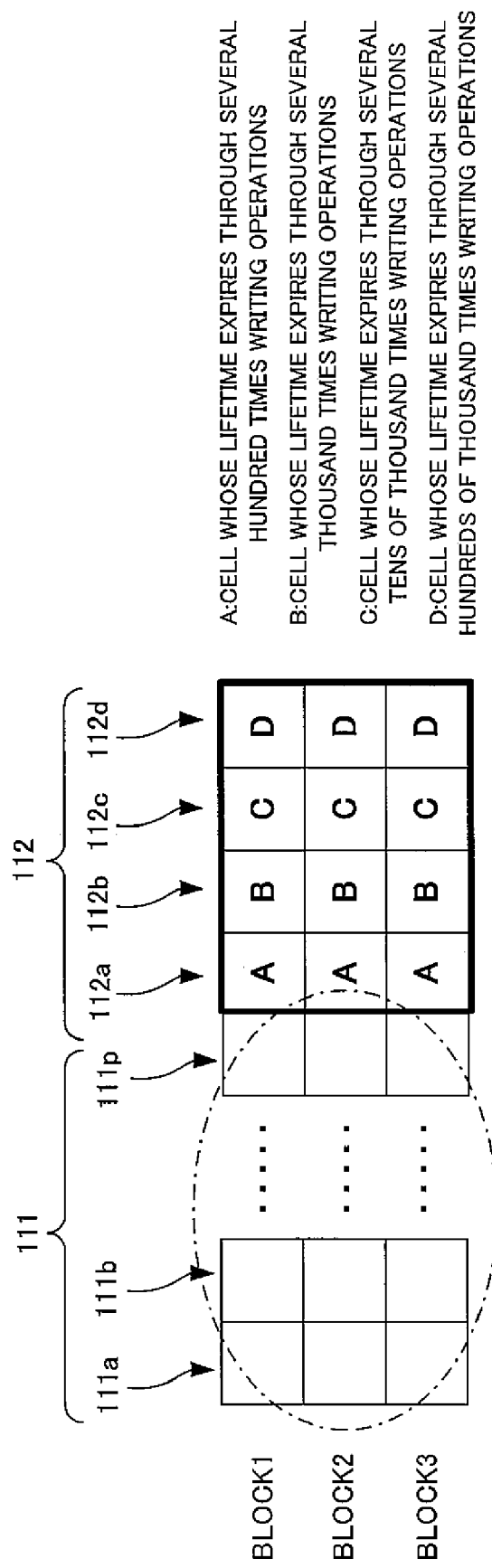
FIG. 3 is a schematic configuration diagram of memory cells and dummy cells in an embodiment of a first nonvolatile memory of the invention.

FIG. 3 is a schematic configuration diagram of the memory cells and the dummy cells in the embodiment of the first nonvolatile memory of the invention.

FIG. 3 illustrates a state in which blocks are arranged, and each block has a memory cell group 111 including memory cells 111a, 111b, 111c, ... , 111p of 16 bits, and a dummy cell group 112 including dummy cells 112a, 112b, 112c and 112d of 4 bits added to the memory cell group 111. Although only three blocks 1, 2 and 3 are illustrated in FIG. 3 to simplify the explanation, the actual nonvolatile memory includes many blocks.

A dummy cell group 112 of each block includes four kinds of dummy cells A, B, C and D having different ranks of rewriting lifetime. First, a first column includes a dummy cell A112a whose lifetime expires if data is written several hundred times, a second column includes a dummy cell B112b whose lifetime expires if data is written several thousand times, a third column includes a dummy cell C112c whose lifetime expires if data is written several tens of thousand times, and a fourth column includes a dummy cell D112d whose lifetime expires if data is written several hundreds of thousand times.

Next, operation of the nonvolatile memory in this embodiment will be explained.

Figure 4:
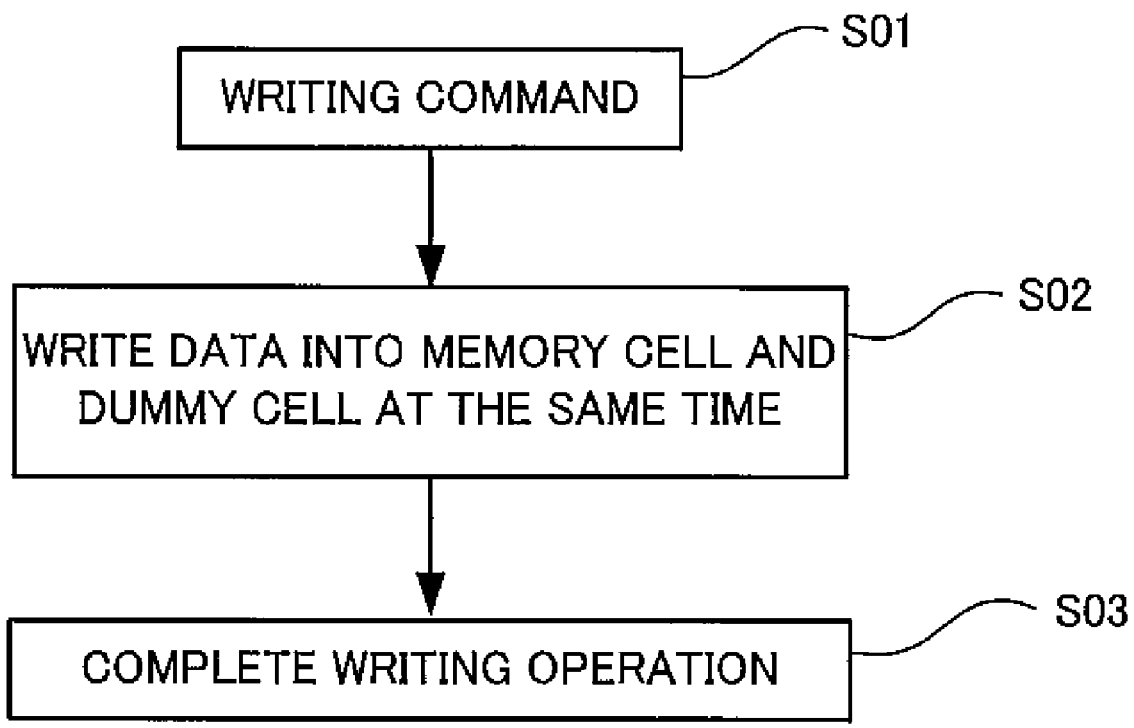
FIG. 4 is a flowchart illustrating operation of a writing circuit in the embodiment of the first nonvolatile memory of the invention.

FIG. 4 is a flowchart illustrating the operation of the writing circuit in the embodiment of the first nonvolatile memory of the invention.

In the first nonvolatile memory of the invention, the writing circuit 141 (see FIG. 1) writes data into the memory cell group 111 in accordance with the command 170 which is input from outside, the address 180 which is input to the address buffer 150 and the writing data 190 which is input to the I/O buffer (step S01). In this data writing operation, data is written into the memory cell group 111 having the designated address, and data is also written into the four dummy cells A, B, C and D in the dummy cell group 112 having the same address at the same time (step S02).

Figure 5:
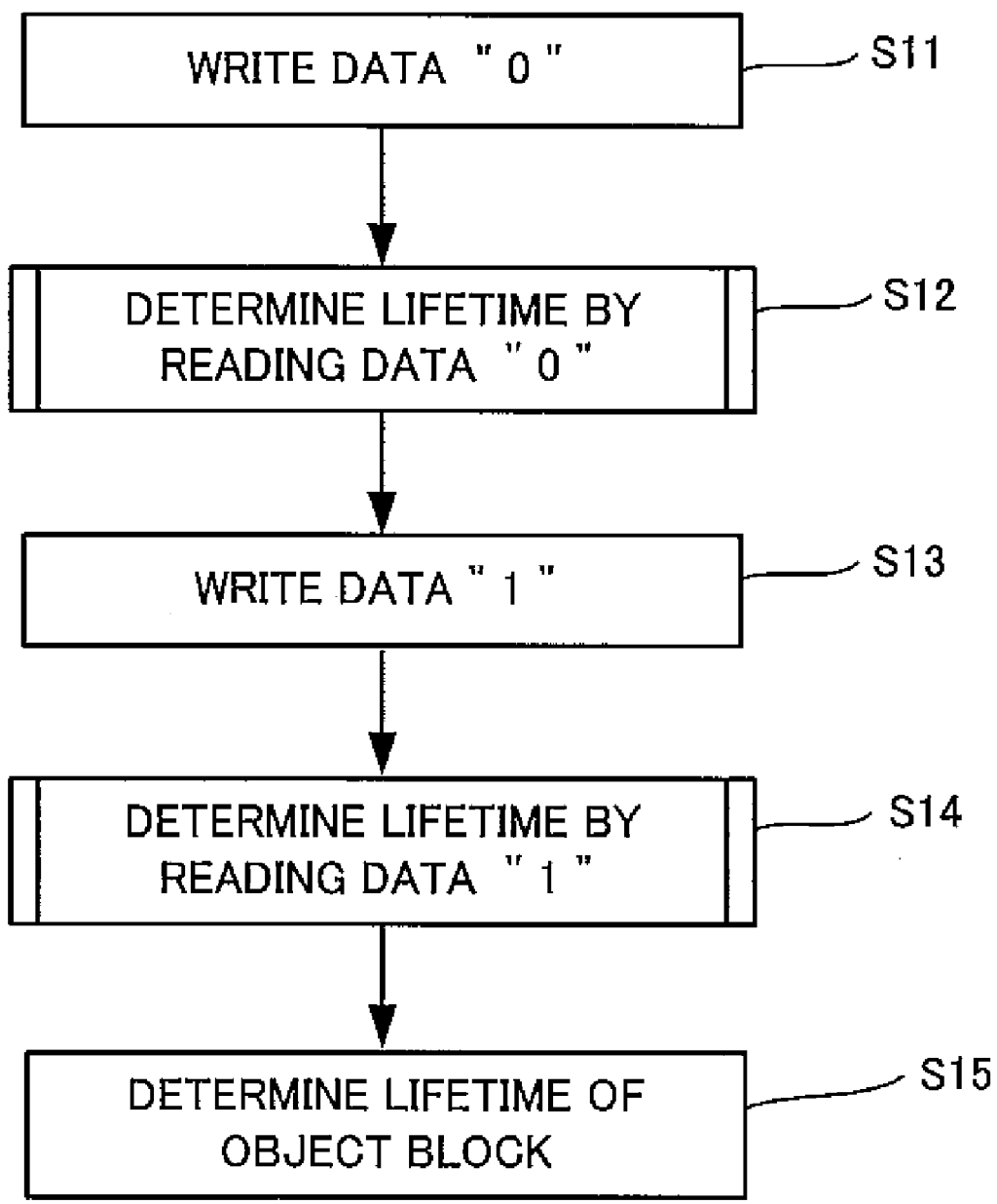
FIG. 5 is a flowchart illustrating a lifetime recognizing operation in the embodiment of the first nonvolatile memory of the invention.
Figure 6:
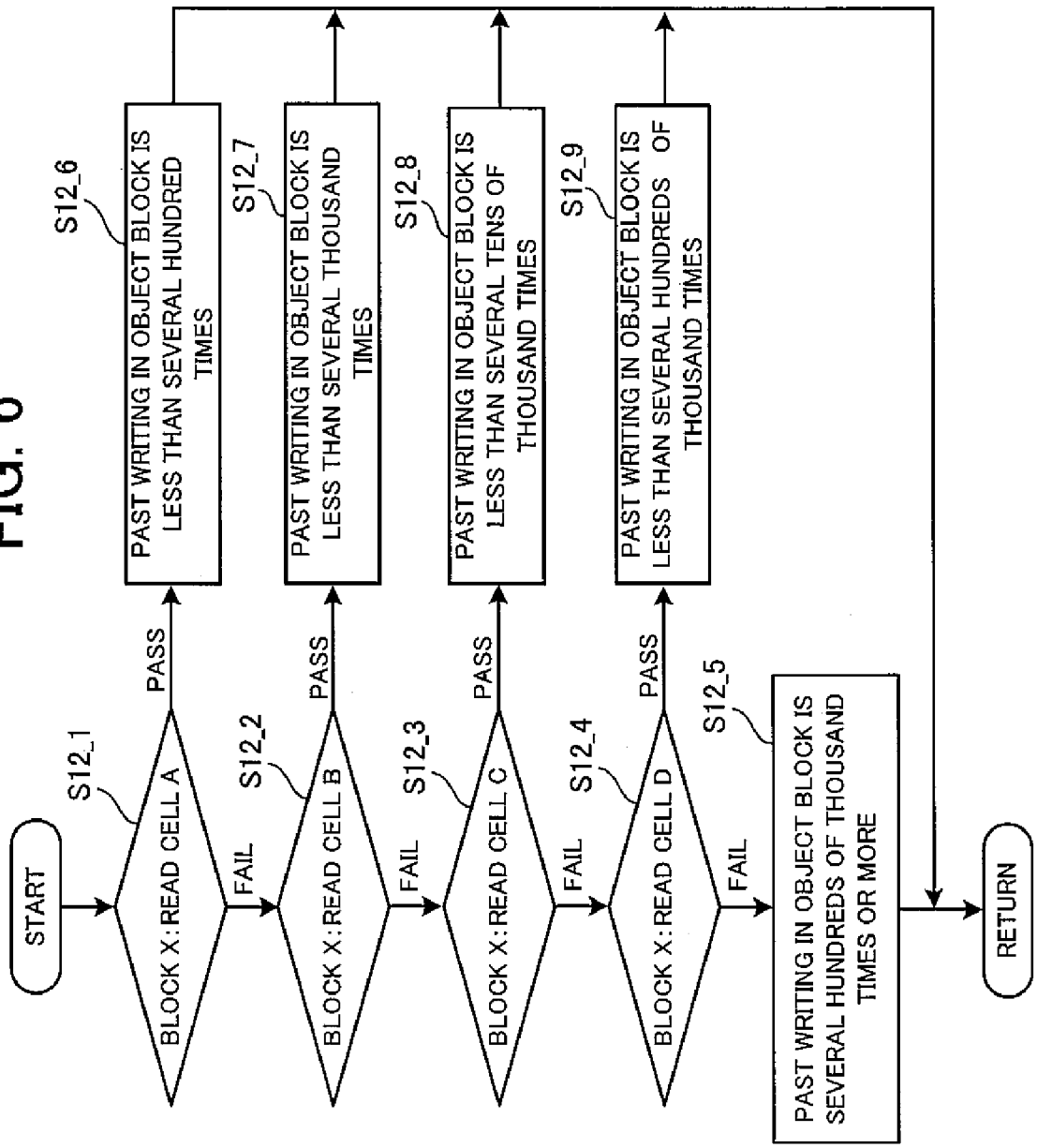
FIG. 6 is a flowchart of a lifetime determining sub-routine of the flowchart of the lifetime recognizing operation in FIG. 5.

FIG. 5 is a flowchart illustrating the lifetime recognizing operation in the embodiment of the first nonvolatile memory of the invention. FIG. 6 is a flowchart of a lifetime determining sub-routine of the flowchart of the lifetime recognizing operation in FIG. 5.

This lifetime recognizing operation is executed in accordance with lifetime determining command which is sent from outside to the nonvolatile memory 100.

Although the actual nonvolatile memory includes a large number of blocks, only three blocks are illustrated in the following description to simplify the explanation.

First, data "0" is written into the dummy cells A, B, C and D in one of the three blocks in the dummy cell group 112 (see FIG. 3) (step S11), data is read from the dummy cells A, B, C and D, and lifetime determination of the one object block is made (step S12).

This lifetime determination is executed based on a lifetime determination routine in FIG. 6 by the lifetime recognizing circuit 142 (see FIG. 1). That is, it is determined whether the data "0" written in step S11 (see FIG. 5) in the dummy cell A in the object block was successfully read (step S12_1). This determination result is recognized as an estimated number of past writing in the lifetime recognizing circuit 142.

If the reading operation was successfully carried out as a result of the determination in step S12_1, it is determined that the number of past writing times into the memory cell group 111 of the object block is less than several hundred times (step S12_6) and then, the processing is returned to the main routine in FIG. 5.

For the dummy cell B of the object block, it is determined whether the data "0" written in step S11 is read successfully in step S12_2. This determination result is also recognized as an estimated number of past writing times in the lifetime recognizing circuit 142. If the reading operation was successfully carried out as a result of determination in step S12_2, it is determined that the number of past writing times in the memory cell group 111 of the object block is less than several thousand times (step S12_7) and then, the processing is returned to the main routine in FIG. 5.

For the dummy cell C of the object block, it is determined whether the data "0" written in step S11 is successfully read in step S12_3. This determination result is also recognized as an estimated number of past writing times in the lifetime recognizing circuit 142. If the reading operation was normally carried out as a result of determination in step S12_3, it is determined that the number of past writing times in the memory cell group 111 of the object block is less than several tens of thousand times (step S12_8) and then, the processing is returned to the main routine in FIG. 5.

For the dummy cell D of the object block, it is determined whether the written data "0" is read normally in step S12_4. This determination result is also recognized as an estimated number of past writing times in the lifetime recognizing circuit 142. If the reading operation was successfully carried out as a result of determination in step S12_4, it is determined that the number of past writing times in the memory cell group 111 of the object block is less than several hundreds of thousand times (step S12_9) and then, the processing is returned to the main routine (see FIG. 5).

On the other hand, if the reading operation was not successfully carried out as a result of determination in step S12_4, the processing is advanced to step S12_5, it is determined that the number of writing times in the memory cell of the object block is equal to or greater than several hundreds of thousand times (step S12_5) and then, the processing is returned to the main routine (see FIG. 5).

If the lifetime determining sub-routine is completed in this manner, the procedure is advanced to step S13 in the flowchart in FIG. 5, data "1" is written in all of the dummy cells A, B, C and D in the object block 1. Then, lifetime determination is carried out by data reading check in all of the dummy cells A, B, C and D in the object block 1 in the lifetime determining sub-routine (see FIG. 6) (step S14).

Since the operation in step S14 is the same as the lifetime determination operation of the data "0", detailed description thereof will be omitted.

If the procedure is returned from the lifetime determining sub-routine to the main routine, the procedure is advanced to step S15 in the flowchart in FIG. 5, and it is determined whether the writing and reading operations of data "0" and data "1" in all of the dummy cells A, B, C and D were successfully carried out, and based on a result of the determination, overall determination for the object block 1 is made. Subsequent to the overall determination of the block 1, steps S11 to S15 are sequentially executed for the blocks 2 and 3 also and the overall determination is carried out in the same manner. If the overall determination for all of the blocks is completed, the final lifetime determination of all of the three blocks, i.e., the nonvolatile memory is made.

Figure 7:
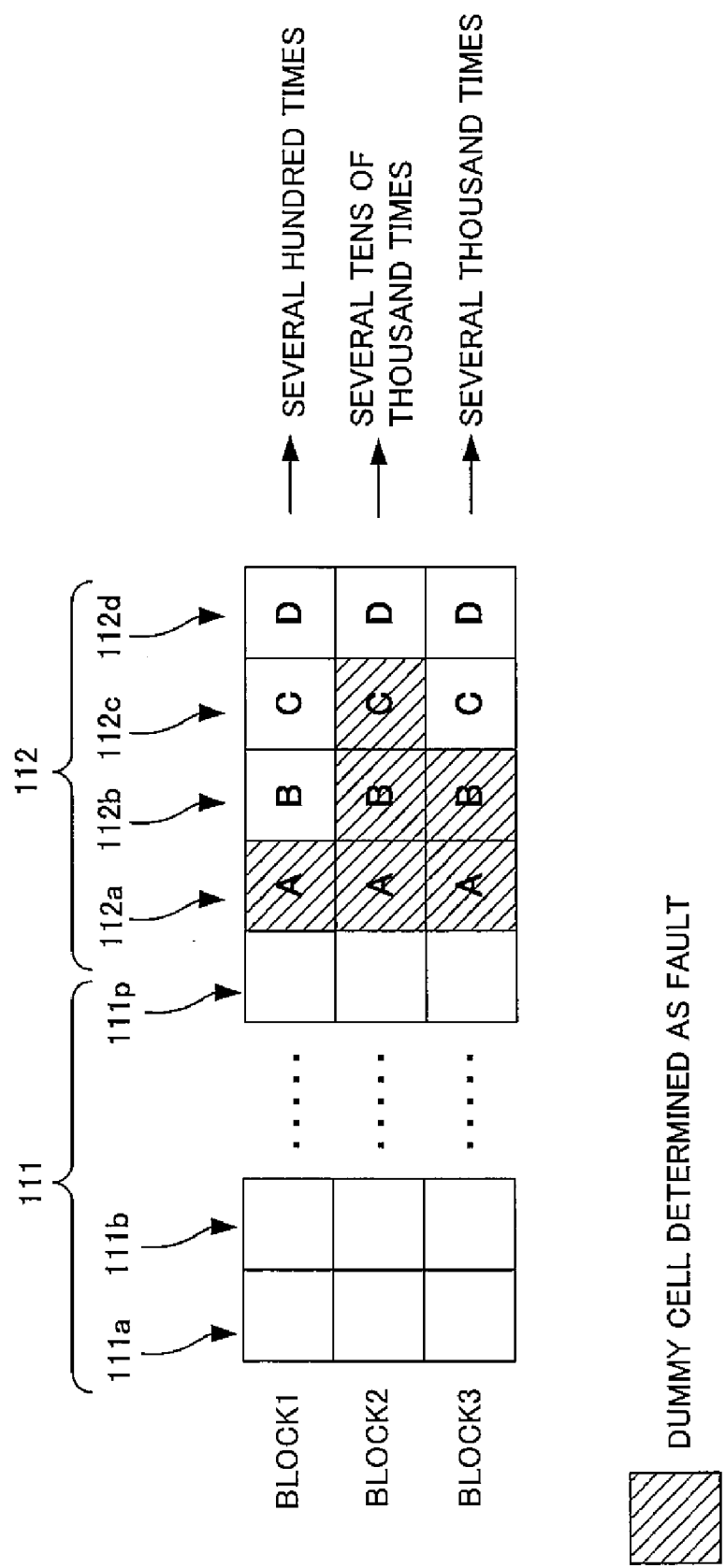
FIG. 7 is a diagram illustrating a lifetime determination result obtained by the embodiment of the first nonvolatile memory of the invention.

FIG. 7 illustrates a result of the lifetime determination obtained by the embodiment of the first nonvolatile memory of the present invention.

FIG. 7 illustrates a determination result in which among the three blocks 1 to 3 of the nonvolatile memory, only the dummy cell A112a malfunctions in the block 1, dummy cells A112a, B112b and C112c malfunction in the block 2, and the dummy cells A112a, and B112b malfunction in block 3.

Since the dummy cell C112c in the block 2 of the three blocks 1 to 3 of the nonvolatile memory malfunctions, it can be determined that the number of past writing times of the memory cell 111 of the nonvolatile memory is about several tens of thousand times and that the nonvolatile memory still has enough lifetime.

Next, an embodiment of a second nonvolatile memory of the present invention will be described.

The second nonvolatile memory of the present invention has substantially the same structure as the schematic configuration diagram of the first nonvolatile memory of the present invention in FIG. 1. The second nonvolatile memory is different from the first nonvolatile memory in that the second nonvolatile memory has a dummy cell 212 (see FIG. 8) which generates access time delay suitable for the number of writing times instead of the dummy cell 112a, 112b, 112c and 112d (see FIG. 7) having different ranks of rewriting lifetime in the first nonvolatile memory, and has a lifetime recognizing circuit which recognizes an estimated number of past writing times by determining a level of access time delay in a dummy cell at the time of reading operation instead of the lifetime recognizing circuit 142 (see FIG. 1). That is, the second nonvolatile memory includes memory cells assigned with respective addresses, arranged for respective words and used for storing one word of data, and a dummy cell for generating access time delay in accordance with the number of writing times. The second nonvolatile memory also includes a writing circuit which, when writing data into one of the memory cells having a given address, also writes the data into a dummy cell having the same address at the same time, and a lifetime recognizing circuit which recognizes an estimated number of past writing times by determining a level of access time delay in the dummy cell at the time of reading operation.

Figure 8:
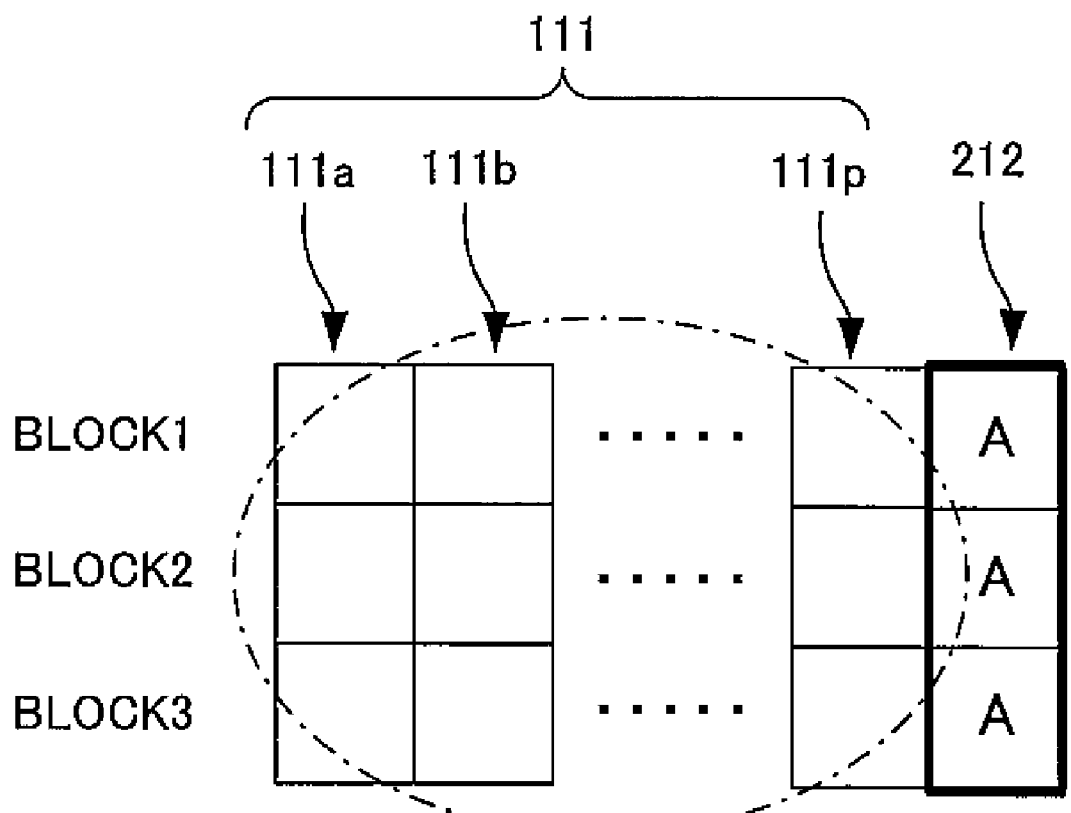
FIG. 8 is a schematic configuration diagram of memory cells and a dummy cell of an embodiment of a second nonvolatile memory of the invention.

FIG. 8 is a schematic configuration diagram of memory cells and a dummy cell in the embodiment of a second nonvolatile memory of the invention.

FIG. 8 illustrates three blocks 1, 2 and 3 each having a memory cell group 111 including memory cells 111a, 111b, 111c, . . . , 111p of 16 bits, and a dummy cell 212 of one bit added to the memory cell group 111. The dummy cell 212 in each block has cells whose lifetimes expire if data is written several hundreds of thousand times. Although only three blocks 1, 2 and 3 are illustrated in FIG. 3 to simplify the explanation, the actual nonvolatile memory includes many blocks.

Also in this second embodiment, the same writing operation as that of the first embodiment in FIG. 4 is carried out.

Next, the lifetime recognizing operation of the embodiment of the second nonvolatile memory of the invention will be explained.

FIG. 9 is an explanatory diagram of operation of the dummy cell in the embodiment of the second nonvolatile memory of the invention.

FIG. 9 illustrates time elapsed until written data is read after the access time of each writing time level of the dummy cell, i.e., after a writing command is issued in the dummy cell. As illustrated in FIG. 9, in the nonvolatile memory, substantially constant reference time X is required until written data is read after the writing command is issued in the dummy cell, but as the number of writing times of the dummy cell are accumulated, delay is generated in access time from writing to reading. That is, if the access time tA is X when the number of writing times in the dummy cell is 0, the access time tA is $X+\alpha$ when the number of writing times is several hundred times, the access time tA is $X+\beta$ when the number of writing times is several thousand times, and the access time tA is $X+\gamma$ when the number of writing times is several tens of thousand.

This embodiment utilizes properties generating access time delay in accordance with increase in the number of writing times of the memory cell, and it is possible to know an estimated number of past writing times into each dummy cell, by previously setting values of X, $\alpha$, $\beta$ and $\gamma$ appropriately and determining a level of access time delay in the dummy cell in each block. Then, it is possible to accurately determine the remaining lifetime of the nonvolatile memory from the estimated number of writing times.

Next, an embodiment of a third nonvolatile memory of the present invention will be explained.

The third nonvolatile memory of the invention has substantially the same structure as the schematic configuration diagram of the first nonvolatile memory of the invention in FIG. 1. The third nonvolatile memory is different from the first nonvolatile memory in that the third nonvolatile memory includes dummy cells 312a, 312b, 312c and 312d (see FIG. 10), which become readable by receiving past electric charges accumulated up to a predetermined amount of electric charge, instead of the dummy cells 112a, 112b, 112c and 112d having different ranks of rewriting lifetimes in the first nonvolatile memory (see FIG. 7). The third nonvolatile memory also includes a lifetime recognizing circuit that recognizes an estimated number of past writing times by determining whether each dummy cell can be read, instead of the lifetime recognizing circuit 142. That is, the third nonvolatile memory includes memory cells assigned with respective addresses, arranged for respective words and used for storing one word of data, and dummy cells which becomes readable by receiving past electric charges accumulated up to a predetermined amount of electric charge. The third nonvolatile memory also includes a writing circuit which, when writing data into a memory cell having a given address, charges electric charge to dummy cells having the same address, and an amount of the electric charge is different depending upon each dummy cell. The third nonvolatile memory also includes a lifetime recognizing circuit which recognizes an estimated number of past writing times by determining whether each dummy cell can be read.

FIG. 10 is a schematic configuration diagram of the memory cells and the dummy cells in the embodiment of the third nonvolatile memory of the invention.

FIG. 10 illustrates three blocks each having a memory cell group 111 including memory cells 111a, 111b, 111c, . . . , 111p of 16 bits, and a dummy cell 312 including dummy cell 312a, dummy cell 312b, dummy cell 312c and dummy cell 312d of 4 bits added to the memory cell group 111.

The dummy cell 312 of each block includes four kinds of a dummy cell A312a, a dummy cell B312b, a dummy cell C312c and a dummy cell D312d, which become readable by receiving past electric charges accumulated up to a predetermined amount of electric charge. That is, in the cell A312a in the first column, the amount of electric charge which is charged at a time is determined such that the electric charge is accumulated up to a level at which reading operation can be done if electric charge is charged several hundred times. In the dummy cell B312b in the second column, the amount of electric charge which is charged at a time is determined such that the electric charge is accumulated up to a level at which reading operation can be done if electric charge is charged several thousand times. In the dummy cell C312c in the third column, the amount of electric charge which is charged at a time is determined such that the electric charge is accumulated up to a level at which reading operation can be done if electric charge is charged several tens of thousand times. In the dummy cell D312d in the fourth column, the amount of electric charge which is charged at a time is determined such that the electric charge is accumulated up to a level at which reading operation can be done if electric charge is charged several hundreds of thousand times.

Although only three blocks 1, 2 and 3 are illustrated in FIG. 10 to simplify the explanation, the actual nonvolatile memory includes many blocks.

Also in this embodiment, data is written in the memory cell groups 111 and the dummy cell groups 312 at the same time, electric charge corresponding to an electric charge amount of several hundredth of an electric charge amount at which data can be read is carried out for the dummy cell A312a, electric charge corresponding to an electric charge amount of several thousandth of an electric charge amount at which data can be read is carried out for the dummy cell B312b, electric charge corresponding to an electric charge amount of several tens of thousandth of an electric charge amount at which data can be read is carried out for the dummy cell C312c, and electric charge corresponding to an electric charge amount of several hundreds of thousandth of an electric charge amount at which data can be read is carried out for the dummy cell D312d.

In this way, by charging different amounts of electric charge into each dummy cell at the same time, after electric charge is charged into memory cells in a certain block several hundred times, only the dummy cell A312a in the block becomes readable. Further, after electric charge is charged into the memory cells in the block several thousand times, the dummy cell A312a and the dummy cell B312b in the block become readable. Further, after electric charge is charged into the memory cells in the block several tens of thousand times, the dummy cell A312a, the dummy cell B312b and the dummy cell C312c in the block become readable.

With this configuration, it is possible to know an estimated number of past writing times by determining whether data can be read from the dummy cells A, B, C and D in each block, thereby enabling accurate determination of remaining lifetime of the nonvolatile memory from the estimated number of past writing times.

What is claimed is:

1. A nonvolatile memory comprising:
a plurality of memory cell groups each of which is arranged for a word representing an unit data amount processed through either one of writing once and reading once, includes a plurality of memory cells for storing the word of data, and is assigned with an address;
a plurality of dummy cell groups each of which is arranged for each of the plurality of memory cell groups, group by group, includes a plurality of dummy cells having respective ranks of rewriting lifetimes, the respective ranks being different from each other, and is assigned with the same address as that of a corresponding memory cell group of the plurality of memory cell groups;
a writing circuit which, when writing data into a memory cell included in a memory cell group having a given address of the plurality of memory cell groups, concurrently writes the data into a dummy cell included in a dummy cell grow having the same address as the given address; and
a lifetime recognizing circuit which recognizes an estimated number of past writing times to a memory cell group of the plurality of memory cell groups arranged for a corresponding dummy cell group of the plurality of dummy cell groups by determining whether each of the plurality of dummy cells included in the corresponding dummy cell group can be successfully accessed.

2. A nonvolatile memory comprising:
a plurality of memory cell groups each of which is arranged for a word representing an unit data amount processed through either one of writing once and reading once, includes a plurality of memory cells for storing the word of data and is assigned with an address;
a plurality of dummy cell groups each of which is arranged for each of the plurality of memory cell groups, group by group, includes a plurality of dummy cells becoming readable by receiving past electric charges accumulated up to a predetermined amount of electric charge, and is assigned with the same address as that of a corresponding memory cell group of the plurality of memory cell groups;
a writing circuit which, when writing data into a memory cell included in a memory cell group having a given address of the plurality of memory cell groups, charges an amount of electric charge different between the plurality of dummy cells in accordance with each of the plurality of dummy cells, to the plurality of dummy cells included in a dummy cell group having the same address as the given address; and
a lifetime recognizing circuit which recognizes an estimated number of past writing times to a memory cell group of the plurality of memory cell groups arranged for a corresponding dummy cell group of the plurality of dummy cell groups by determining whether each dummy cell of the plurality of dummy cells included in the corresponding dummy cell group can be read.

* * * * *